(12) United States Patent
Sugo et al.

(10) Patent No.: US 10,748,866 B2
(45) Date of Patent: Aug. 18, 2020

(54) THERMAL BONDING SHEET, THERMAL BONDING SHEET WITH DICING TAPE, BONDED BODY PRODUCTION METHOD, AND POWER SEMICONDUCTOR DEVICE

(71) Applicant: NITTO DENKO CORPORATION, Ibaraki-shi, Osaka (JP)

(72) Inventors: Yuki Sugo, Ibaraki (JP); Nao Kamakura, Ibaraki (JP); Satoshi Honda, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 16/074,839

(22) PCT Filed: Dec. 13, 2016

(86) PCT No.: PCT/JP2016/087075
§ 371 (c)(1),
(2) Date: Aug. 2, 2018

(87) PCT Pub. No.: WO2017/163503
PCT Pub. Date: Sep. 28, 2017

(65) Prior Publication Data
US 2019/0043824 A1    Feb. 7, 2019

(30) Foreign Application Priority Data

Mar. 23, 2016    (JP) .................................. 2016-058584

(51) Int. Cl.
*H01L 21/60* (2006.01)
*H01L 23/00* (2006.01)
(Continued)

(52) U.S. Cl.
CPC ............ *H01L 24/32* (2013.01); *B22F 1/0044* (2013.01); *B22F 7/08* (2013.01); *B23K 20/00* (2013.01);
(Continued)

(58) Field of Classification Search
CPC ......... H01L 2224/8084; H01L 21/2007; H01L 2021/60015; B22F 3/1003
See application file for complete search history.

(56) References Cited

U.S. PATENT DOCUMENTS

2005/0156325 A1    7/2005  You Yang
2005/0263238 A1*  12/2005  Takase ................... C03C 14/00
                                                                156/89.11
(Continued)

FOREIGN PATENT DOCUMENTS

CN    102280427 A    12/2011
EP    2923781 A1      9/2015
(Continued)

OTHER PUBLICATIONS

ISA Japan Patent Office, International Search Report Issued in Application No. PCT/JP2016/087075, dated Mar. 14, 2017, WIPO, 2 pages.
(Continued)

*Primary Examiner* — George R Fourson, III
(74) *Attorney, Agent, or Firm* — Alleman Hall Creasman & Tuttle LLP

(57) ABSTRACT

A thermal bonding sheet includes a pre-sintering layer containing copper particles and polycarbonate.

7 Claims, 2 Drawing Sheets

(51) Int. Cl.
  *B23K 20/00* (2006.01)
  *H01L 21/52* (2006.01)
  *B22F 7/08* (2006.01)
  *B23K 35/02* (2006.01)
  *B23K 35/30* (2006.01)
  *B23K 35/36* (2006.01)
  *B22F 1/00* (2006.01)
  *H01L 21/683* (2006.01)
  *B23K 101/40* (2006.01)
  *B23K 35/38* (2006.01)
  *B22F 7/00* (2006.01)

(52) U.S. Cl.
  CPC ........ *B23K 35/0233* (2013.01); *B23K 35/302* (2013.01); *B23K 35/3613* (2013.01); *H01L 21/52* (2013.01); *H01L 21/6836* (2013.01); *H01L 24/27* (2013.01); *H01L 24/83* (2013.01); *B22F 7/008* (2013.01); *B22F 2999/00* (2013.01); *B23K 35/383* (2013.01); *B23K 2101/40* (2018.08); *H01L 2021/60015* (2013.01); *H01L 2224/48091* (2013.01); *H01L 2224/73265* (2013.01); *H01L 2224/83191* (2013.01); *H01L 2924/01029* (2013.01); *H01L 2924/181* (2013.01); *H01L 2924/2011* (2013.01)

(56) References Cited

U.S. PATENT DOCUMENTS

| | | | |
|---|---|---|---|
| 2012/0125659 A1 | 5/2012 | Nakako et al. | |
| 2014/0008588 A1* | 1/2014 | Fujimoto | C08K 5/3415 252/514 |
| 2015/0266090 A1* | 9/2015 | Kamikoriyama | B22F 9/24 252/512 |
| 2016/0151864 A1* | 6/2016 | Rector | B22F 3/10 428/615 |
| 2017/0021602 A1* | 1/2017 | Yang | H05K 3/368 |
| 2017/0369744 A1* | 12/2017 | Sugo | C09J 133/26 |
| 2018/0030203 A1* | 2/2018 | Nakano | C08G 64/42 |
| 2018/0257142 A1* | 9/2018 | Kamakura | B22F 1/0059 |
| 2018/0265744 A1* | 9/2018 | Sugo | C09J 9/00 |
| 2018/0269175 A1* | 9/2018 | Sugo | C09J 7/10 |
| 2018/0273808 A1* | 9/2018 | Kamakura | C09J 7/10 |
| 2018/0277507 A1* | 9/2018 | Sugo | C09J 1/00 |
| 2018/0315729 A1* | 11/2018 | Sugo | H01L 21/6836 |
| 2019/0035513 A1* | 1/2019 | Nagai | H01B 1/026 |
| 2019/0043824 A1* | 2/2019 | Sugo | H01L 21/6836 |
| 2019/0047081 A1* | 2/2019 | Kamakura | B22F 7/08 |
| 2019/0051807 A1* | 2/2019 | Okumura | H01L 35/08 |
| 2019/0077930 A1* | 3/2019 | Irie | B32B 27/08 |
| 2019/0136046 A1* | 5/2019 | Nakano | C08L 69/00 |
| 2019/0177207 A1* | 6/2019 | Ishioka | C03C 8/06 |
| 2019/0184460 A1* | 6/2019 | Honda | B22F 3/02 |
| 2019/0256651 A1* | 8/2019 | Nakano | C08G 64/34 |

FOREIGN PATENT DOCUMENTS

| | | | |
|---|---|---|---|
| EP | 2859961 A3 | 11/2015 | |
| EP | 3358607 A1 | 8/2018 | |
| EP | 3358608 A1 | 8/2018 | |
| EP | 3358609 A1 | 8/2018 | |
| JP | 04154659 A | * | 5/1992 |
| JP | 06334282 A | * | 12/1994 |
| JP | 2002030306 A | 1/2002 | |
| JP | 2005166938 A | 6/2005 | |
| JP | 2008031491 A | 2/2008 | |
| JP | 2014111800 A | 6/2014 | |
| JP | 2015040238 A | * | 3/2015 |
| TW | 1399457 B1 | 6/2013 | |
| TW | 201444940 A | 12/2014 | |
| TW | 201517061 A | 5/2015 | |
| WO | 2015034579 A1 | 3/2015 | |
| WO | 2015154236 A1 | 10/2015 | |

OTHER PUBLICATIONS

International Bureau of WIPO, International Preliminary Report on Patentability Issued in Application No. PCT/JP2016/087075, dated Oct. 4, 2018, WIPO, 7 pages.

European Patent Office, Extended European Search Report Issued in Application No. 16895526.8, dated Jan. 28, 2019, Germany, 10 pages.

Japanese Patent Office, Office Action Issued in Application No. 2016058584, dated Aug. 21, 2019, 10 pages.

European Patent Office, Office Action Issued in Application No. 16895526.8, dated Aug. 28, 2019, Netherlands, 5 pages.

European Patent Office, Extended European Search Report Issued in Application No. 16895526.8, dated Apr. 6, 2020, Germany, 5 pages.

China National Intellectual Property Administration, Office Action and Search Report Issued in Application No. 201680083876.4, dated Jan. 6, 2020, 17 pages.

Taiwan Intellectual Property Office, Office Action and Search Report Issued in Application No. 106101824, dated May 23, 2020, 12 pages. (Submitted with Translation of Search Report).

\* cited by examiner

THERMAL BONDING SHEET, THERMAL BONDING SHEET WITH DICING TAPE, BONDED BODY PRODUCTION METHOD, AND POWER SEMICONDUCTOR DEVICE

TECHNICAL FIELD

The present invention relates to a thermal bonding sheet, a thermal bonding sheet with dicing tape, a bonded body production method, and a power semiconductor device.

BACKGROUND ART

In the manufacture of a semiconductor device, a method for bonding a semiconductor element to an adherend such as a metal lead frame (a so-called die bonding method) has been developed from a conventional method for using gold-silicon eutectic bonding to a method for using solder or a resin paste. At the present time, an electrically conductive resin paste may be used.

In recent years, a power semiconductor device for controlling and supplying electric power has been remarkably widely used. Since a current always flows in the power semiconductor device, the power semiconductor device has a large heat value. Therefore, an electrically conductive adhesive used for the power semiconductor device desirably has high heat dissipation properties and low electric resistivity.

Low loss and a high-speed operation are required for the power semiconductor device. Conventionally, semiconductors using Si such as IGBT (Insulated Gate Bipolar Transistor) and MOSFET (Metal-Oxide-Semiconductor Field-Effect Transistor) have been used for the power semiconductor device. In recent years, power semiconductor devices using semiconductors such as SiC and GaN are developed, and are expected to expand from now on.

The semiconductors using SiC and GaN have features such as a large band gap and a high breakdown electrical field to achieve low loss, a high-speed operation, and a high-temperature operation. The high-temperature operation provides a merit in an automobile and a small power converter or the like used under a severe heat environment. In the semiconductor device used under a severe heat environment, a high-temperature operation at about 250° C. is assumed. This causes problems in heat characteristics and reliability in solder and an electrically conductive adhesive as conventional bonding and adhesive materials. Then, conventionally, a sintering metal particle-containing paste material has been proposed (for example, see Patent Document 1). The sintering metal particle-containing paste material contains nanomicro-sized metal particles. These metal particles are melted at a temperature lower than a usual melting point according to a nanosized effect, so that sintering between the particles is achieved.

PRIOR ART DOCUMENTS

Patent Documents

Patent Document 1: JP-A-2014-111800

In many cases, the sintered metal particle-containing paste material contains particles mainly containing silver as sintered metal particles. However, this causes a problem that the sintered metal particle-containing paste material mainly containing a precious metal such as silver becomes expensive.

The sintered metal particle-containing paste material is in a paste state, so that it causes variations during application, and this disadvantageously causes a lowered yield ratio of a bonded body to be produced.

The present invention has been made in view of the above problems, and it is an object of the present invention to provide a thermal bonding sheet that is inexpensive and can provide an improved yield ratio of a bonded body to be produced, and a thermal bonding sheet with dicing tape including the thermal bonding sheet. Another object of the present invention is to provide a bonded body production method using the thermal bonding sheet. Still another object of the present invention is to provide a power semiconductor device including the thermal bonding sheet.

Means for Solving the Problems

Conventionally, the sintering temperature (temperature at which sintering proceeds at an accelerated rate) of low temperature sinterable copper particles is known to be about 260 to 270° C. When a thermal bonding sheet containing copper particles is studied, the sheet is not constituted by only the copper particles, so that the copper particles are considered to be contained in a binder (for example, a thermally decomposable binder), to provide a sheet. However, in many cases, the temperature at which the binder is thermally decomposed is close to, or higher than the sintering temperature of the copper particles. Therefore, when the copper particles are sintered, the binder still remains, which causes a problem that the sintering does not suitably proceed.

The present inventors have studied to solve the above problems. As a result, it has been surprisingly found that, when a sheet containing copper particles and polycarbonate is heated, a temperature at which the polycarbonate is thermally decomposed is decreased, and is somewhat lower than the sintering temperature of the copper particles. When the copper particles are used as sintered metal particles of a thermal bonding sheet and the polycarbonate is used as a binder, most of the polycarbonate is thermally decomposed at an early stage in a sintering step, and the influence of the polycarbonate on the sintering of the copper particles can be reduced.

The present invention has been made based on the above findings.

That is, a thermal bonding sheet according to the present invention includes a pre-sintering layer containing copper particles and polycarbonate.

According to the above configuration, the pre-sintering layer contains copper particles and polycarbonate, so that most of the polycarbonate is thermally decomposed at an early stage in a sintering step. As a result, the thermal bonding sheet including the pre-sintering layer can bond two objects to be bonded utilizing the sintering of the copper particles. In particular, most of the polycarbonate is thermally decomposed at an early stage in the sintering step, so that the sintering proceeds suitably. This makes it possible to obtain a bonded body with a high yield ratio.

According to the above configuration, the thermal bonding sheet is not a paste but a sheet, which can suppress a compositional material of the thermal bonding sheet from protruding during bonding and from creeping up onto the surface of an object to be bonded.

The use of the copper particles can provide more inexpensive production than that in the use of a noble metal such as silver.

In the above configuration, the copper particles preferably have an average particle size in a range of 10 to 1000 nm.

When the average particle size of the copper particles is 1000 nm or less, a sintering temperature can be more suitably lowered. On the other hand, when the average particle size of the copper particles is 10 nm or more, the particles can be suitably dispersed in the sheet.

In the above configuration, it is preferable that each of the copper particles is composed of a plurality of crystallites; and each of the crystallites has a crystallite diameter of 50 nm or less.

When the crystallite diameter of each of the crystallites is 50 nm or less, the sintering temperature can be more suitably lowered.

A thermal bonding sheet with dicing tape according to the present invention includes:

a dicing tape; and the thermal bonding sheet stacked on the dicing tape.

The thermal bonding sheet with dicing tape allows a step of bonding the dicing tape to the thermal bonding sheet to be omitted since the thermal bonding sheet is integrated with the dicing tape. It is possible to provide a bonded body with a high yield ratio due to the inclusion of the thermal bonding sheet. The thermal bonding sheet is not a paste but a sheet, which can suppress a compositional material of the thermal bonding sheet from protruding during bonding and from creeping up onto the surface of an object to be bonded.

The use of the copper particles for the thermal bonding sheet can provide more inexpensive production than that in the use of a noble metal such as silver.

A bonded body production method according to the present invention includes the steps of:

preparing the thermal bonding sheet; and thermally bonding two objects to be bonded with the thermal bonding sheet interposed between the two objects to be bonded, in which a bonding temperature in the thermal bonding step is in a range of 200 to 400° C.

The above configuration uses the thermal bonding sheet, so that most of the polycarbonate is thermally decomposed at an early stage in the sintering step by performing thermal bonding (sintering the copper particles) at 200 to 400° C. Therefore, sintering proceeds suitably. This makes it possible to obtain a bonded body with a high yield ratio.

In the above configuration, the thermal bonding step is preferably performed in a nitrogen atmosphere, in a reduced pressure, or in a reducing gas atmosphere.

Copper particles have nature of being oxidized at high temperatures. When the objects to be bonded are made of copper, these are oxidized at high temperatures. Therefore, when the thermal bonding step is performed in the nitrogen atmosphere, in the reduced pressure, or in the reducing gas atmosphere, it is possible to prevent the oxidation of the copper particles and the like caused by heating.

A power semiconductor device according to the present invention includes:

the thermal bonding sheet; and a power semiconductor element.

The above configuration includes the thermal bonding sheet, which makes it possible to provide a power semiconductor device capable of operating in a high-temperature environment of, for example, around 250° C. and having excellent thermal characteristics and reliability.

MODE FOR CARRYING OUT THE INVENTION (Thermal Bonding Sheet with Dicing Tape)

Figure 1:
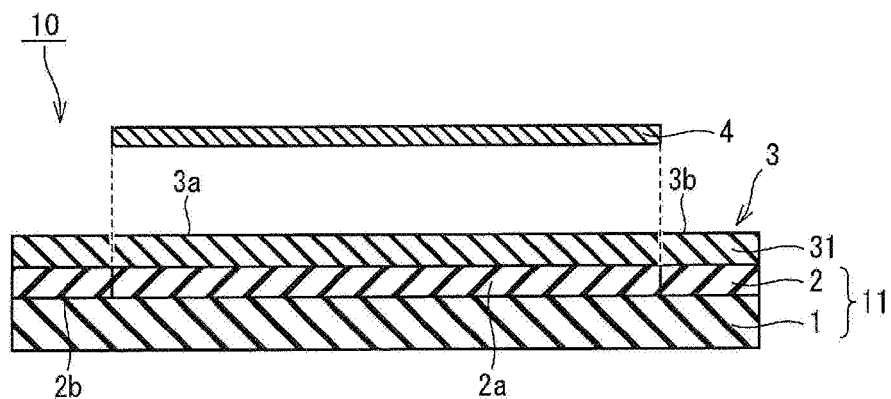
FIG. 1 is a schematic cross-sectional view showing a thermal bonding sheet with dicing tape according to an embodiment of the present invention.
Figure 2:
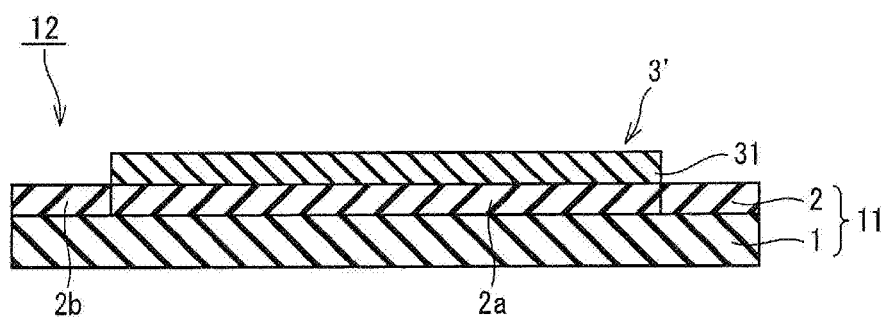
FIG. 2 is a schematic cross-sectional view showing a thermal bonding sheet with dicing tape according to another embodiment of the present invention.

A thermal bonding sheet according to one embodiment of the present invention and a thermal bonding sheet with dicing tape will be described below. Examples of the thermal bonding sheet according to the present embodiment include a thermal bonding sheet in which a dicing tape is not pasted to the thermal bonding sheet in a thermal bonding sheet with dicing tape to be described below. Therefore, hereinafter, the thermal bonding sheet with dicing tape will be described, where the thermal bonding sheet will be described. FIG. 1 is a schematic sectional view showing a thermal bonding sheet with dicing tape according to one embodiment of the present invention. FIG. 2 is a schematic sectional view showing a thermal bonding sheet with dicing tape according to another embodiment of the present invention.

As shown in FIG. 1, a thermal bonding sheet with dicing tape 10 has a configuration in which a thermal bonding sheet 3 is laminated on a dicing tape 11. The dicing tape 11 is configured by laminating a pressure-sensitive adhesive layer 2 on a base 1, and the thermal bonding sheet 3 is provided on the pressure-sensitive adhesive layer 2. A thermal bonding sheet with dicing tape of the present invention may also have a configuration in which a thermal bonding sheet 3' is formed only on a work piece pasting portion as in a thermal bonding sheet with dicing tape 12 shown in FIG. 2.

(Thermal Bonding Sheet)

Thermal bonding sheets 3, 3' are sheet-shaped. The thermal bonding sheet is not a paste but a sheet, which can suppress a compositional material of the thermal bonding sheet from protruding during bonding and from creeping up onto the surface of an object to be bonded.

The thermal bonding sheet 3, 3' according to the present embodiment include one pre-sintering layer 31. The pre-sintering layer means a layer serving as a sintered layer after predetermined heating.

In the present embodiment, the case where the thermal bonding sheet is composed of one pre-sintering layer will be described. However, the thermal bonding sheet of the present invention is not limited to this example as long as it has a pre-sintering layer. The number of the pre-sintering layer is not limited to 1, and the pre-sintering layer may be formed of a plurality of layers having different compositions.

The thermal bonding sheet of the present invention may be a sheet composed of two or more layers such as a pre-sintering layer and another layer. For example, the thermal bonding sheet of the present invention may be a sheet in which a first pre-sintering layer is exposed on one surface and a second pre-sintering layer is exposed on the other surface. Specifically, the thermal bonding sheet may be a sheet in which a first pre-sintering layer, another layer, and a second pre-sintering layer are stacked in this order. For example, in this case, the first pre-sintering layer may have the same composition as, or a different composition from that of the second pre-sintered layer.

(Pre-Sintering Layer)

The pre-sintering layer 31 contains copper particles. The copper particles may be made of pure copper, and may be copper containing silicon (Si), phosphorus (P), carbon (C), zirconia (Zr), titanium (Ti), sulfur (S), chlorine (Cl), oxygen (O) and the like. The content of elements other than copper is preferably 0 to 2% by mass based on the total content of copper and elements other than copper. The copper particles made of pure copper can provide more suitable thermal bonding.

The copper particles preferably have an average particle size in the range of 10 to 1000 nm, more preferably in the range of 50 to 800 nm, and still more preferably in the range of 100 to 500 nm. When the average particle size of the copper particles is 1000 nm or less, a sintering temperature can be more suitably lowered. On the other hand, when the average particle size of the copper particles is 10 nm or more, the dispersibility of the particles is improved.

The average particle size of the copper particles is measured by the following method.
1. The pre-sintering layer is ion-polished in a cooling environment to expose a cross section of the pre-sintering layer.
2. An image of the cross section is taken by using a field emission type scanning electron microscope SU 8020 (manufactured by Hitachi High-Technologies Corporation). Imaging conditions of an acceleration voltage of 5 kV and a magnification ratio of 50000 times are set, and a reflected electron image is obtained as image data.
3. Using image analysis software Image J, the obtained image data is subjected to automatic binarization processing, and the average particle size of the particles is then calculated.

The shape of each of the copper particles is not particularly limited, and examples thereof include a spherical shape, a rod shape, a scale shape, and an indefinite shape.

It is preferable that the copper particle is composed of a plurality of crystallites. In this case, the crystallites have a crystallite diameter of preferably 50 nm or less, and more preferably 45 nm or less. When the crystallite diameter of each of the crystallites is 50 nm or less, the sintering temperature can be more suitably lowered.

The crystallite diameter is a value calculated by Scherrer method using a (111) peak obtained by performing X-ray diffraction measurement of copper powder using Ultima IV manufactured by Rigaku Corporation.

The content of the copper particles is preferably in the range of 60 to 98% by weight, more preferably in the range of 65 to 97% by weight, and still more preferably in the range of 70 to 95% by weight, based on the total weight of the pre-sintering layer 31. The metal fine particles contained in the range of 60 to 98% by weight make it possible to suitably bond the objects to be bonded.

The pre-sintering layer 31 may contain the low-boiling binder. The low-boiling binder is used to facilitate the handling of the copper particles. The low-boiling binder is also used to adjust optional mechanical properties. Specifically, the low-boiling binder can be used as a copper particles-containing paste in which the copper particles are dispersed in the low-boiling binder.

The low-boiling binder is liquid at 23° C. Herein, the term "liquid" includes semiliquid. Specifically, it means that viscosity at 23° C. obtained by viscosity measurement with a dynamic viscoelasticity measuring device (rheometer) is 100,000 Pa·s or less.

Conditions for viscosity measurement are as follows.
Rheometer: MARS III manufactured by Thermo SCIENTIFIC Inc.
jig: Parallel plate: 20 mmϕ, gap: 100 μm, shear rate: 1/sec)

Specific examples of the low-boiling binder include monohydric and polyhydric alcohols such as pentanol, hexanol, heptanol, octanol, 1-decanol, ethylene glycol, diethylene glycol, propylene glycol, butylene glycol, and 2,4-diethyl-1,5-pentanediol; terpene alcohols such as citronellol, geraniol, nellol, carveol, α-terpineol, and isobornyl cyclohexanol; ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; and ethylene glycol ethyl ether acetate, ethylene glycol butyl ether acetate, diethylene glycol ethyl ether acetate, diethylene glycol butyl ether acetate, and dipropylene glycol methyl ether acetate (DPMA). These may be used in combination of two or more thereof. Among these, two kinds of low-boiling binders having different boiling points are preferably used in combination. When two kinds of low-boiling binders having different boiling points are used, an excellent sheet shape is maintained. Among these, when the pre-sintering layer contains the terpene alcohol, higher flexibility can be imparted to the pre-sintering layer.

The pre-sintering layer 31 contains polycarbonate as a thermally decomposable binder. The pre-sintering layer 31 contains polycarbonate as the thermally decomposable binder, which makes it easy to maintain the shape of the sheet before the thermal bonding step. During the thermal bonding step, the layer is likely to be thermally decomposed.

The polycarbonate is not particularly limited as long as the polycarbonate can be thermally decomposed in the thermal bonding step. Examples of the polycarbonate include aliphatic polycarbonate containing an aliphatic chain without containing an aromatic compound (for example, a benzene ring or the like) between ester carbonate groups (—O—CO—O—) as a main chain, and aromatic polycarbonate containing an aromatic compound between ester carbonate groups (—O—CO—O—) as a main chain. Among these, aliphatic polycarbonate is preferred.

Examples of the aliphatic polycarbonate include polyethylene carbonate and polypropylene carbonate. Among these, polypropylene carbonate is preferred from the viewpoint of solubility in an organic solvent when a varnish for forming a sheet is produced.

Examples of the aromatic polycarbonate include those having a bisphenol A structure as a main chain.

The weight average molecular weight of the polycarbonate is suitably in a range of 10,000 to 1,000,000. The weight average molecular weight is a value that is measured by GPC (gel permeation chromatography) and calculated in terms of polystyrene.

The pre-sintering layer 31 may contain a thermally decomposable binder other than polycarbonate (hereinafter also referred to as "another thermally decomposable binder").

Herein, the term "thermally decomposable binder" refers to a binder that can be thermally decomposed in the thermal bonding step. It is preferable that the thermally decomposable binder hardly remains in the sintered layer (the pre-sintering layer 31 after being heated) after the thermal bonding step.

The pre-sintering layer 31 may appropriately contain, for example, a flux component and the like, in addition to the above components.

The thermal bonding sheets 3 and 3' can be manufactured by an ordinary method. For example, a varnish for forming the pre-sintering layer 31 that contains each of the above-described components is produced. The varnish is applied onto a substrate separator to form a coating film so as to have a prescribed thickness, and the coating film is then dried to allow the thermal bonding sheets 3 and 3' to be manufactured.

A solvent that is used in the varnish is not particularly limited. However, an organic solvent or an alcoholic solvent is preferred which allows each of the above-described components to be dissolved, kneaded, or dispersed, uniformly. Examples of the organic solvent include ketone-based solvents such as dimethylformamide, dimethylacetamide, N-methylpyrrolidone, acetone, methylethylketone, and cyclohexanone; toluene; and xylene. Examples of the alcoholic solvent include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerin, octanediol, 2-methyl-2,4-pentanediol, and terpineol.

The applying method is not particularly limited. Examples of methods for coating a solvent include a die coater, a gravure coater, a roll coater, a reverse coater, a comma coater, a pipe doctor coater, and screen printing. Among these, a die coater is preferred in terms of high uniformity in an application thickness. The drying condition of the coating film is not particularly limited. For example, drying can be performed at a drying temperature of 70° C. to 160° C. for a drying time of 1 minute to 5 minutes. Even after the coating film is dried, some solvents may remain in the coating film without the solvents being wholly evaporated.

When the pre-sintering layer 31 contains the low-boiling binder, a part of the low-boiling binder may be volatilized depending on the drying condition. Therefore, the ratios of the respective components constituting the pre-sintering layer 31 vary according to the drying condition. For example, even in the pre-sintering layer 31 formed of the same varnish, the content of the fine metal particles in the entire pre-sintering layer 31 and the content of the thermally decomposable binder are increased as a drying temperature is higher and a drying time is longer. Therefore, the drying condition is preferably set so that the fine metal particles and the thermally decomposable binder are contained in desired amounts in the pre-sintering layer 31.

Polyethylene terephthalate (PET), polyethylene, polypropylene, and a plastic film or a paper or the like whose surface is coated with a peeling agent such as a fluorine based peeling agent and a long chain alkylacrylate based peeling agent can be used as the substrate separator.

A method for mixing each of the above-described components with a mixer and press-molding the obtained mixture to manufacture the thermal bonding sheets 3 and 3' is also suitable as the method for manufacturing the thermal bonding sheets 3 and 3'. Examples of the mixer include a planetary mixer.

The thickness of the thermal bonding sheets 3 and 3' at 23° C. before heating is preferably 5 to 100 μm, and more preferably 10 to 80 μm. The thickness at 23° C. is 5 μm or more, which can further prevent the constitutional material of the thermal bonding sheets 3 and 3' from protruding. On the other hand, the thickness is 100 μm or less, which can further prevent a slope from occurring during thermal bonding.

(Dicing Tape)

A dicing tape 11 has a configuration in which a pressure-sensitive adhesive layer 2 is laminated on a base 1.

The base 1 preferably has ultraviolet transmissivity and is a base body for strength of the thermal bonding sheets with dicing tape 10 and 12. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene (meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base 1 includes a polymer such as a cross-linked body of the above resins. The above plastic film may be also used unstreched, or may be also used on which a monoaxial or a biaxial stretching treatment is performed depending on necessity. According to resin sheets in which heat shrinkable properties are given by the stretching treatment, etc., the adhesive area of the pressure-sensitive adhesive layer 2 and the thermal bonding sheet 3, 3' is reduced by thermally shrinking the base 1 after dicing, and the recovery of the semiconductor chips can be facilitated.

A known surface treatment such as a chemical or physical treatment such as a chromate treatment, ozone exposure, flame exposure, high voltage electric exposure, and an ionized ultraviolet treatment, and a coating treatment by an undercoating agent (for example, a tacky substance described later) can be performed on the surface of the base 1 in order to improve adhesiveness, holding properties, etc. with the adjacent layer.

The thickness of the base 1 can be appropriately decided without limitation particularly.

The pressure-sensitive adhesive that is used to form the pressure-sensitive adhesive layer 2 is not especially limited. Examples include a general pressure-sensitive adhesive such as an acrylic pressure-sensitive adhesive and a rubber based pressure-sensitive adhesive. As the pressure-sensitive adhesive, an acrylic pressure-sensitive adhesive having an acrylic polymer as a base polymer is preferable from the aspect of a cleaning and washing property of a semiconductor wafer and an electronic component such as a glass which are vulnerable to contamination by ultrapure water and an organic solvent such as alcohol.

Examples of the acrylic polymer include acrylic polymers using, as a monomer component, one or more kinds of (meth)acrylic acid alkyl esters (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and (meth)acrylic acid cycloalkyl esters (for example, cyclopentylester, cyclohexylester, etc.). The (meth)acrylic acid ester means an acrylic acid ester and/or a methacrylic acid ester, and has very the same meaning as (meth) in the present invention.

The acrylic polymer may optionally contain a unit corresponding to a different monomer component copolymerizable with the above-mentioned alkyl ester of (meth)acrylic acid or cycloalkyl ester thereof in order to improve the cohesive force, heat resistance or some other property of the polymer. Examples of such a monomer component include carboxyl-containing monomers such as acrylic acid, methacrylic acid, carboxyethyl (meth)acrylate, carboxypentyl (meth)acrylate, itaconic acid, maleic acid, fumaric acid, and crotonic acid; acid anhydride monomers such as maleic anhydride, and itaconic anhydride; hydroxyl-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxylmethylcyclohexyl)methyl (meth)acrylate; sulfonic acid group containing monomers such as styrenesulfonic acid, allylsulfonic acid, 2-(meth)acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group containing monomers such as 2-hydroxyethylacryloyl phosphate; acrylamide; and acrylonitrile. These copolymerizable monomer components may be used alone or in combination of two or more thereof. The amount of the copolymerizable monomer(s) to be used is preferably 40% or less by weight of all the monomer components.

For crosslinking, the acrylic polymer can also contain multifunctional monomers if necessary as the copolymerizable monomer component. Such multifunctional monomers include hexane diol di(meth)acrylate, (poly)ethylene glycol di(meth)acrylate, (poly)propylene glycol di(meth)acrylate, neopentyl glycol di(meth)acrylate, pentaerythritol di(meth)acrylate, trimethylol propane tri(meth)acrylate, pentaerythritol tri(meth)acrylate, dipentaerythritol hexa(meth)acrylate, epoxy (meth)acrylate, polyester (meth)acrylate, urethane (meth)acrylate etc. These multifunctional monomers can also be used as a mixture of one or more thereof. From the viewpoint of adhesiveness etc., the use amount of the multifunctional monomer is preferably 30 wt % or less based on the whole monomer components.

The above acryl-based polymer is obtained by polymerizing a mixture of one or two or more kinds of monomers. The polymerization can be performed by applying an appropriate manner such as a solution polymerization manner, an emulsion polymerization manner, a bulk polymerization manner, or a suspension polymerization manner. From the viewpoint of prevention of contamination of a clean adherend, or the like, the content of a low molecular weight material is preferably prevented. From this viewpoint, the acryl-based polymer preferably has a number average molecular weight of preferably 100,000 or more, more preferably 200,000 to 3,000,000, and particularly preferably 300,000 to 1,000,000.

To increase the number-average molecular weight of the base polymer such as acrylic polymer etc., an external crosslinking agent can be suitably adopted in the pressure-sensitive adhesive. The external crosslinking method is specifically a reaction method that involves adding and reacting a crosslinking agent such as a polyisocyanate compound, epoxy compound, aziridine compound, melamine crosslinking agent, urea resin, anhydrous compound, polyamine, carboxyl group-containing polymer. When the external crosslinking agent is used, the amount of the crosslinking agent to be used is determined suitably depending on balance with the base polymer to be crosslinked and applications thereof as the pressure-sensitive adhesive. In general, the crosslinking agent is compounded preferably about 5 parts by weight or less, and more preferably 0.1 to 5 parts by weight to 100 parts by weight of the base polymer. The conventionally known various additives such as a tackifier and an anti-aging agent may be used as the pressure-sensitive adhesive besides the above-described components as needed.

The pressure-sensitive adhesive layer 2 can be formed with a radiation curing-type pressure-sensitive adhesive. The adhesive strength of the radiation curing-type pressure-sensitive adhesive can be easily reduced by increasing the degree of crosslinking by irradiation with radiation such as ultraviolet rays. A difference in the adhesive strength with the portion 2b can be created by irradiating, with radiation, only the portion 2a that corresponds to the workpiece pasting portion of the pressure-sensitive adhesive layer 2 shown in FIG. 2.

The portion 2a where the adhesive strength is remarkably reduced can be easily formed by curing the radiation curing-type pressure-sensitive adhesive layer 2 in accordance with the thermal bonding sheet 3' shown in FIG. 2. Since the thermal bonding sheet 3' is pasted to the portion 2a that is cured and has decreased adhesive strength, the interface between the portion 2a of the pressure-sensitive adhesive layer 2 and the thermal bonding sheet 3' has a property of easily peeling during pickup. On the other hand, the portion that is not irradiated with radiation has sufficient adhesive strength, and forms the portion 2b. The pressure-sensitive adhesive layer may be irradiated with radiation after dicing before pickup.

As described above, in the pressure-sensitive adhesive layer 2 of the thermal bonding sheet with dicing tape 10 shown in FIG. 1, the portion 2b that is formed with an uncured radiation curing-type pressure-sensitive adhesive adheres to the thermal bonding sheet 3, and the holding power can be secured during dicing. Thus, the radiation curable-type pressure-sensitive adhesive can support can support the thermal bonding sheet 3 for fixing a chip-shaped workpiece (semiconductor chip or the like) to an adherend such as a substrate with a good balance between adhesion and peeling. In the pressure-sensitive adhesive layer 2 of the thermal bonding sheet with dicing tape 11 shown in FIG. 2, the portion 2b can fix a wafer ring.

For the radiation curing-type pressure-sensitive adhesive, one having a radiation-curable functional group such as a carbon-carbon double bond and showing adherability can be used without particular limitation. Examples of the radiation curing-type pressure-sensitive adhesive include an addition-type radiation-curable pressure-sensitive adhesive obtained by blending a radiation-curable monomer component or an oligomer component with a general pressure-sensitive adhesive such as the above-mentioned acryl-based pressure-sensitive adhesive or rubber-based pressure-sensitive adhesive.

Examples of the radiation-curable monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth)acrylate. Further, the radiation-curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the radiation-curable monomer component and the oligomer component can be appropriately determined to an amount in which the adhesive strength of the pressure-sensitive adhesive layer can be decreased depending on the type of the pressure-sensitive adhesive layer. Generally, it is for example 5 to 500 parts by weight, and preferably about 40 to 150 parts by weight based on 100 parts by weight of the base polymer such as an acrylic polymer constituting the pressure sensitive adhesive.

Further, besides the addition-type radiation-curable pressure-sensitive adhesive described above, the radiation curing-type pressure-sensitive adhesive includes an intrinsic-type radiation-curable pressure-sensitive adhesive using an acrylic polymer having a radical reactive carbon-carbon double bond in the polymer side chain, in the main chain, or at the end of the main chain as the base polymer. The intrinsic-type radiation-curable pressure-sensitive adhesives of an internally provided type are preferable because they do not have to contain the oligomer component, etc. that is a low molecular component, or most of them do not contain, they can form a pressure-sensitive adhesive layer having a stable layer structure without migrating the oligomer component, etc. in the pressure sensitive adhesive over time.

The above-mentioned base polymer, which has a carbon-carbon double bond, may be any polymer that has a carbon-carbon double bond and further has viscosity. As such a base polymer, a polymer having an acrylic polymer as a basic skeleton is preferable. Examples of the basic skeleton of the acrylic polymer include the acrylic polymers exemplified above.

The method for introducing a carbon-carbon double bond into any one of the above-mentioned acrylic polymers is not particularly limited, and may be selected from various methods. The introduction of the carbon-carbon double bond into a side chain of the polymer is easier in molecule design. The method is, for example, a method of copolymerizing a monomer having a functional group with an acrylic polymer, and then causing the resultant to condensation-react or addition-react with a compound having a functional group reactive with the above-mentioned functional group and a carbon-carbon double bond while keeping the radial ray curability of the carbon-carbon double bond.

Examples of the combination of these functional groups include a carboxylic acid group and an epoxy group; a carboxylic acid group and an aziridine group; and a hydroxyl group and an isocyanate group. Of these combinations, the combination of a hydroxyl group and an isocyanate group is preferable from the viewpoint of the easiness of reaction tracing. If the above-mentioned acrylic polymer, which has a carbon-carbon double bond, can be produced by the combination of these functional groups, each of the functional groups may be present on any one of the acrylic polymer and the above-mentioned compound. It is preferable for the above-mentioned preferable combination that the acrylic polymer has the hydroxyl group and the above-mentioned compound has the isocyanate group. Examples of the isocyanate compound in this case, which has a carbon-carbon double bond, include methacryloyl isocyanate, 2-methacryloyloxyethyl isocyanate, and m-isopropenyl-α,α-dimethylbenzyl isocyanate. The used acrylic polymer may be an acrylic polymer copolymerized with any one of the hydroxyl-containing monomers exemplified above, or an ether compound such as 2-hydroxyethyl vinyl ether, 4-hydroxybutyl vinyl ether or diethylene glycol monovinyl ether.

The intrinsic-type radiation-curable pressure-sensitive adhesive may be made only of the above-mentioned base polymer (in particular, the acrylic polymer), which has a carbon-carbon double bond. However, the above-mentioned radiation-curable monomer component or oligomer component may be incorporated into the base polymer to such an extent that properties of the adhesive are not deteriorated. The amount of the radiation-curable oligomer component or the like is usually 30 parts or less by weight, preferably from 0 to 10 parts by weight for 100 parts by weight of the base polymer.

In the case that the radiation-curable pressure-sensitive adhesive is cured with ultraviolet rays or the like, a photopolymerization initiator is incorporated into the adhesive. Examples of the photopolymerization initiator include α-ketol compounds such as 4-(2-hydroxyethoxy)phenyl(2-hydroxy-2-propyl)ketone, α-hydroxy-α,α'-dimethylacetophenone, 2-methyl-2-hydroxypropiophenone, and 1-hydroxycyclohexyl phenyl ketone; acetophenone compounds such as methoxyacetophenone, 2,2-dimethoxy-2-phenylacetophenone, 2,2-diethoxyacetophenone, and 2-methyl-1-[4-(methylthio)-phenyl]-2-morpholinopropane-1; benzoin ether compounds such as benzoin ethyl ether, benzoin isopropyl ether, and anisoin methyl ether; ketal compounds such as benzyl dimethyl ketal; aromatic sulfonyl chloride compounds such as 2-naphthalenesulfonyl chloride; optically active oxime compounds such as 1-phenone-1,1-propanedione-2-(o-ethoxycarbonyl)oxime; benzophenone compounds such as benzophenone, benzoylbenzoic acid, and 3,3'-dimethyl-4-methoxybenzophenone; thioxanthone compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketones; acylphosphonoxides; and acylphosphonates. The amount of the photopolymerization initiator to be blended is, for example, from about 0.05 to 20 parts by weight for 100 parts by weight of the acrylic polymer or the like which constitutes the adhesive as a base polymer.

Further, examples of the radiation-curable pressure-sensitive adhesive which is used in the formation of the pressure-sensitive adhesive layer 2 include such as a rubber pressure-sensitive adhesive or an acryl pressure-sensitive adhesive which contains an addition-polymerizable compound having two or more unsaturated bonds, a photopolymerizable compound such as alkoxysilane having an epoxy group, and a photopolymerization initiator such as a carbonyl compound, an organic sulfur compound, a peroxide, an amine, and an onium salt compound, which are disclosed in JP-A No. 60-196956. Examples of the above addition-polymerizable compound having two or more unsaturated bonds include such as polyvalent alcohol ester or oligoester of acryl acid or methacrylic acid and an epoxy or a urethane compound.

The radiation curing-type pressure-sensitive adhesive layer 2 can contain a compound that is colored by radiation irradiation as necessary. The compound that is colored by radiation irradiation is contained in the pressure-sensitive adhesive layer 2, so that only a portion irradiated with radiation can be colored. That is, the portion 2a corresponding to the workpiece pasting portion 3a shown in FIG. 1 can be colored. Therefore, whether the pressure-sensitive adhesive layer 2 is irradiated with radiation can be immediately confirmed by visual observation, which easily recognizes the workpiece pasting portion 3a, and easily pastes the workpiece. When a semiconductor chip is detected by a photosensor or the like, the detecting accuracy of the semiconductor chip is increased, which causes no malfunction during the pickup of the semiconductor chip. The compound that is colored by radiation irradiation is colorless or has a pale color before the radiation irradiation. However, the compound is colored by irradiation with radiation. Examples of the compound include a leuco dye. The ratio of use of this compound that is colored by radiation irradiation can be appropriately set.

The thickness of the pressure-sensitive adhesive layer 2 is not particularly limited. However, the thickness is preferably about 1 µm to about 50 µm from the viewpoint of preventing cracking on the cut surface of the chip and maintaining the fixation of the thermal bonding sheets 3 and 3'. The thickness is preferably 2 µm to 30 µm, and more preferably 5 µm to 25 µm.

The dicing tape 11 according to the present embodiment are produced, for example, by the following procedure.

First, the base 1 can be formed by a conventionally known film-forming method. The film-forming method includes, for example, a calendar film-forming method, a casting method in an organic solvent, an inflation extrusion method in a closed system, a T-die extrusion method, a co-extrusion method, and a dry lamination method.

Next, a pressure-sensitive adhesive composition solution is applied on the base 1 to form a coated film and the coated film is dried under predetermined conditions (optionally crosslinked with heating) to form the pressure-sensitive adhesive layer 2. Examples of the application method include, but are not limited to, roll coating, screen coating and gravure coating methods. Drying is conducted under the drying conditions, for example, the drying temperature within a range from 80 to 150° C. and the drying time within a range from 0.5 to 5 minutes. The pressure-sensitive adhesive layer 2 may also be formed by applying a pressure-sensitive adhesive composition on a separator to form a coated film and drying the coated film under the drying conditions. Then, the pressure-sensitive adhesive layer 2 is laminated on the base together with the separator. Thus, the dicing tape 11 is produced.

The thermal bonding sheet with dicing tape 10 and 12 can be manufactured by an ordinary method. For example, the pressure-sensitive adhesive layer 2 of the dicing tape 11 can be pasted to the thermal bonding sheet 3 to manufacture the thermal bonding sheet with dicing tape 10.

In the thermal bonding sheet with dicing tape 10, it is preferable that the thermal bonding sheet 3 be covered with the separator. Examples thereof include a method for bonding the dicing tape 11 and the thermal bonding sheet 3 to each other, peeling off the substrate separator stacked on the thermal bonding sheet 3, and bonding a separator to the exposed surface of the thermal bonding sheet 3 of the thermal bonding sheet with dicing tape 10 after the substrate separator is peeled off. That is, it is preferable that the dicing tape 11, the thermal bonding sheet 3, and the separator be stacked in this order.

In the above-described embodiment, the thermal bonding sheet with dicing tape in which the dicing tape and the thermal bonding sheet are stacked has been described. However, the thermal bonding sheet of the present invention may be provided in a state of not being bonded to the dicing tape.

When the dicing tape is not bonded to the thermal bonding sheet, the thermal bonding sheet is preferably a thermal bonding sheet with separator on each of surfaces, in which the thermal bonding sheet is sandwiched between two separators. That is, it is preferable to form the thermal bonding sheet with separator on each of surfaces in which the first separator, the thermal bonding sheet, and the second separator are stacked in this order.

Figure 3:
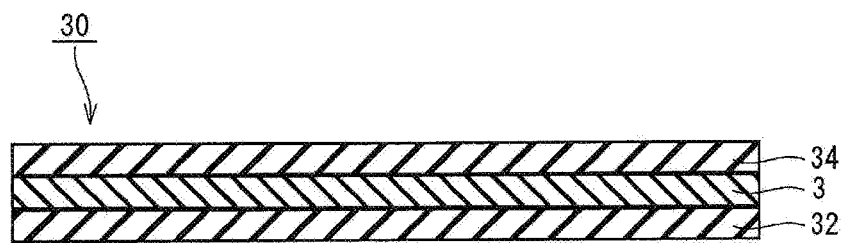
FIG. 3 is a schematic cross-sectional view showing a thermal bonding sheet with separator on each of surfaces.

FIG. 3 is a schematic cross-sectional view showing an embodiment of the thermal bonding sheet with separator on each of surfaces.

A thermal bonding sheet with separator on each of surfaces 30 shown in FIG. 3 has a configuration in which a first separator 32, the thermal bonding sheet 3, and a second separator 34 are stacked in this order. As the first separator 32 and the second separator 34, the same separator as the substrate separator can be used.

When the dicing tape is not bonded to the thermal bonding sheet, a separator may be stacked on only one surface of the thermal bonding sheet.

(Bonded Body Production Method)

The bonded body production method according to the present embodiment includes at least the steps of:
preparing the thermal bonding sheet; and
thermally bonding two objects to be bonded with the thermal bonding sheet interposed between the two objects to be bonded,
in which a bonding temperature in the thermal bonding step is in a range of 200 to 400° C.

Hereinafter, the case where the bonded body in the present invention is a semiconductor device and the objects to be bonded in the present invention are a semiconductor chip and an adherend will be described. However, the objects to be bonded in the present invention are not limited to this example as long as the objects can be bonded by using the thermal bonding sheet. The bonded body in the present invention may be bonded by using the thermal bonding sheet, and is not limited to the semiconductor device.

(Semiconductor Device Production Method)

The semiconductor device production method according to the present embodiment includes at least the steps of:
preparing the thermal bonding sheet; and
thermally bonding a semiconductor chip onto an adherend with the thermal bonding sheet interposed between the semiconductor chip and the adherend,
in which a bonding temperature in the thermal bonding step is in a range of 200 to 400° C. (hereinafter also referred to as a first embodiment).

As described above, the semiconductor chip and the adherend correspond to the objects to be bonded in the present invention.

The semiconductor device production method according to the present embodiment includes:
a step of preparing the thermal bonding sheet with dicing tape;
a bonding step of bonding the thermal bonding sheet in the thermal bonding sheet with dicing tape to a back surface of a semiconductor wafer;
a dicing step of dicing the semiconductor wafer together with the thermal bonding sheet to form a chip-like semiconductor chip;
a pickup step of picking up the semiconductor chip together with the thermal bonding sheet from the thermal bonding sheet with dicing tape; and
a thermal bonding step of thermally bonding the semiconductor chip onto an adherend with the thermal bonding sheet interposed between the semiconductor chip and the adherend, in which a bonding temperature in the thermal bonding step is in a range of 200 to 400° C. (hereinafter also referred to as a second embodiment).

The method for manufacturing a semiconductor device according to the first embodiment and the method for manufacturing a semiconductor device according to the second embodiment are different from each other in that the method according to the second embodiment uses the thermal bonding sheet with dicing tape, by contrast, the method according to the first embodiment uses the thermal bonding sheet alone. These methods are common in the other points. If a step of pasting the thermal bonding sheet to the dicing tape after preparing the thermal bonding sheet is performed in the method for manufacturing a semiconductor device according to the first embodiment, the following steps can be performed in the same manner as in the method for manufacturing a semiconductor device according to the second embodiment. So, hereinafter, the method for manufacturing a semiconductor device according to the second embodiment will be described.

In the method for manufacturing a semiconductor device according to the present embodiment, first, thermal bonding sheets with dicing tape 10 and 12 are prepared (preparing step). After a separator that is optionally provided on the thermal bonding sheets 3, 3' is appropriately peeled off, the thermal bonding sheets with dicing tape 10 and 12 are used as follows. Hereinafter, a case where the thermal bonding sheet with dicing tape 10 is used will be described as an example with reference to FIG. 1 and FIG. 4.

First, a semiconductor wafer 4 is press-adhered on a semiconductor wafer pasting portion 3a of the thermal bonding sheet in the thermal bonding sheet with dicing tape 10, and the semiconductor wafer 4 is fixed by adhering and holding (pasting step). The present step is performed while pressing with a pressing means such as a pressing roll. The pasting temperature upon mounting is not particularly limited, and preferably in a range of 23 to 90° C., for example.

The semiconductor wafer 4 is preferably a semiconductor wafer in which an electrode pad is formed on one surface and a silver thin film is formed on the outermost surface of the other surface (hereinafter also referred to as back surface). The thickness of the silver thin film is, for example, 10 nm to 1000 nm. A titanium thin film may be further formed between the semiconductor wafer 4 and the silver thin film. The thickness of the titanium thin film is, for example, 10 nm to 1000 nm. When the silver thin film is formed, a semiconductor chip 5 and the thermal bonding sheet 3 can be thermally bonded to each other solidly in the thermal bonding step described later. When the titanium thin film is formed, the reliability of an electrode is improved. The silver thin film and the titanium thin film can be formed by vapor deposition, for example.

Next, the dicing of the semiconductor wafer 4 is performed (dicing step). Accordingly, the semiconductor wafer 4 is cut into a prescribed size and individualized, to manufacture a semiconductor chip 5. The dicing method is not particularly limited, and the method is performed according to a normal method from the circuit face side of the semiconductor wafer 4, for example. The present step can adopt a cutting method called full-cut that forms a slit in the thermal bonding sheet with dicing tape 10, or the like, for example. The dicing apparatus used in the present step is not particularly limited, and a conventionally known apparatus can be used. Since the semiconductor wafer 4 is adhered and fixed by the thermal bonding sheet with dicing tape 10, chip crack and chip fly can be prevented, and at the same time the damage of the semiconductor wafer 4 can be also prevented.

Next, pickup of the semiconductor chip 5 is performed in order to peel the semiconductor chip 5 that is adhered and fixed to the thermal bonding sheet with dicing tape 10 (pickup step). The method for picking up is not particularly limited, and various conventionally known methods can be adopted. Examples thereof include a method for pushing up the individual semiconductor chip 5 from the thermal bonding sheet with dicing tape 10 side with a needle and picking up the pushed semiconductor chip 5 with a pickup apparatus.

As pickup conditions, a needle push-up speed is preferably set to 5 to 100 mm/second, and more preferably 5 to 10 mm/second from the viewpoint of preventing chipping.

When the pressure-sensitive adhesive layer 2 is an ultraviolet-ray curing-type layer, pickup is performed after irradiating the pressure-sensitive adhesive layer 2 with ultraviolet rays. Accordingly, the adhesive strength of the pressure-sensitive adhesive layer 2 to the thermal bonding sheet 3 is decreased, and the peeling of the semiconductor chip 5 becomes easy. As a result, picking up becomes possible without damaging the semiconductor chip 5. The conditions such as irradiation intensity and irradiation time during irradiation with ultraviolet rays are not particularly limited, and may be appropriately set as necessary. A known light source can be used as a light source used for irradiation with ultraviolet rays. When a pressure-sensitive adhesive layer is previously cured by irradiation with ultraviolet rays, and the cured pressure-sensitive adhesive layer is pasted to a thermal bonding sheet, the irradiation with ultraviolet rays is unnecessary.

Next, the semiconductor chip 5 is temporarily adhered to an adherend 6 with the thermal bonding sheet 3 interposed between the semiconductor chip 5 and the adherend 6. The temporary adhering step can be performed by using a chip mounter and the like. As a temporary adhesion condition, temporary adhesion is preferably performed under a pressure of 0.01 MPa to 5 MPa. A temperature during temporary adhesion is not particularly limited, and it is preferably in the range of 23 to 150° C., for example. A pressure time is preferably 0.01 to 5 seconds.

Next, the semiconductor chip 5 is thermally bonded to an adherend 6 with the thermal bonding sheet 3 sandwiched therebetween (thermal bonding step). Examples of the adherend 6 include a lead frame, a TAB film, a substrate, and a semiconductor chip that is separately produced. The adherend 6 may be a deformation type adherend that can be easily deformed or a non-deformation type adherend that is difficult to be deformed (semiconductor wafer or the like), for example.

Examples of the lead frame include a metal lead frame such as a Cu lead frame or a 42 Alloy lead frame. As the substrate, a conventionally known substrate can be used. Examples thereof include an organic substrate made of glass epoxy, BT (bismaleimide-triazine), or polyimide. Among these, the metal lead frame can be integrated with the copper particles by thermal bonding. Examples of the substrate include an insulating circuit board in which a copper circuit board is laminated on an insulating substrate such as a ceramic plate. By using the insulating circuit board, a power semiconductor device for controlling and supplying electric power can be manufactured, for example.

In the thermal bonding step, the copper particles are sintered by heating, and the polycarbonate as the thermally-decomposable binder is thermally decomposed. The residual low-boiling binder which has not been sufficiently volatilized in the drying step is volatilized. A bonding temperature is preferably 200 to 400° C., more preferably 190 to 370° C., and still more preferably 200 to 350° C. A bonding time is preferably 0.3 to 300 minutes, more preferably 0.5 to 240 minutes, and still more preferably 1 to 180 minutes. Thermal bonding may be performed under a pressurized condition. The pressurized condition is preferably in a range of 1 to 500 kg/cm$^2$, and more preferably in a range of 5 to 400 kg/cm$^2$. Thermal bonding under pressure can be executed by an apparatus that can simultaneously perform heating and pressurizing such as a flip chip bonder, for example. A parallel plate press may also be used. It is preferable that the thermal bonding step is performed in a nitrogen atmosphere, in a reduced pressure, or in a reducing gas atmosphere. Copper particles have nature of being oxidized at high temperatures. When the objects to be bonded are made of copper, these are oxidized at high temperatures. Therefore, when the thermal bonding step is performed in the nitrogen atmosphere, in the reduced pressure, or in the reducing gas atmosphere, it is possible to prevent the oxidation of the copper particles and the like caused by heating.

A temperature increasing step may be performed before the thermal bonding step.

For example, after the temporary adhering step, the following steps may be performed.

A temperature increasing step of increasing the temperature of a laminate including the semiconductor chip 5, the thermal bonding sheet 3, and the adherend 6 from a temperature equal to or lower than a first temperature to a second temperature; and a step of thermally bonding the semiconductor chip 5 and the adherend 6 while holding the temperature of the laminate within a predetermined range (thermal bonding step) after the temperature increasing step.

The first temperature varies depending on the composition of the pre-sintering layer, and examples thereof include 50° C., 80° C., and 100° C.

This temperature increasing step may be performed as follows, for example. At least one of the parallel flat plates is preheated to the first temperature, and the laminate is then sandwiched between the parallel flat plates. Thereafter, the temperature of the laminate is increased to the second temperature at a predetermined temperature increasing rate.

The temperature increasing rate is preferably 0.1° C./s or more, more preferably 0.5° C./s or more, and still more preferably 1° C./s or more. The temperature increasing rate is preferably 5° C./s or less, more preferably 3° C./s or less, and still more preferably 2° C./s or less. When the temperature increasing rate is 2° C./s or less, raid heating can be further suppressed. On the other hand, when the temperature increasing rate is 0.1° C./s or more, the process can be shortened.

The second temperature is a temperature at the start of the thermal bonding step, and is a temperature at which sintering substantially starts.

The second temperature varies depending on the composition of the pre-sintering layer, and examples thereof include 200° C., 250° C., and 300° C.

The laminate 10 may be pressurized while the temperature of the laminate 10 is increased from the temperature equal to or lower than the first temperature to the second temperature. The laminate is pressurized at preferably in the range of 5 to 40 MPa, and more preferably in the range of 5 to 15 MPa. When the laminate is pressurized at 5 MPa or more, a bonded body having stronger bonding is obtained. When the laminate is pressurized at 40 MPa or less, the load on the chip can be reduced. The pressurization may be pressurization with certain pressure, or pressurization while changing pressure in a certain range.

The laminate may be constantly pressurized while the temperature is increased from the temperature equal to or lower than the first temperature to the second temperature. The laminate may be pressurized during at least a part of the period. This is because when the laminate is pressurized during at least a part of the period, more suitable bonding is obtained. For example, the temperature increase may be started from the temperature equal to or lower than the first temperature without pressurizing, the pressurization may be started before the temperature reaches the second temperature after the lapse of a certain period of time.

Figure 4:
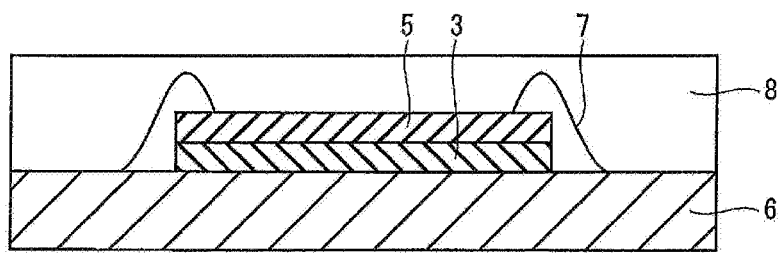
FIG. 4 is a schematic cross-sectional view for describing a manufacturing method of a semiconductor device according to the present embodiment.

Next, as necessary, as shown in FIG. 4, the tip of a terminal part (inner lead) of the adherend 6 is electrically connected with an electrode pad (not shown) on the semiconductor chip 5 with a bonding wire 7 (wire bonding step). As the bonding wire 7, for example, a gold wire, an aluminum wire, or a copper wire or the like is used. The temperature when the wire bonding is performed is from 23 to 300° C., and preferably from 23 to 250° C. The heating time is from several seconds to several minutes. The connection of the wires is performed using a combination of vibration energy based on ultrasonic waves with compression energy based on the application of pressure in a state where the wires are heated to a temperature in the above-mentioned range.

Next, as necessary, as shown in FIG. 4, the semiconductor chip 5 is sealed with a sealing resin 8 (sealing step). This step is performed for protecting the semiconductor chip 5 that is loaded on the adherend 6 and the bonding wire 7. This step can be performed by molding a resin for sealing with a mold. As the sealing resin 8, an epoxy-based resin is used, for example. The resin sealing is usually performed at a heating temperature of 175° C. for 60 to 90 seconds, but the present invention is not limited thereto. For example, curing can be performed at 165 to 185° C. for several minutes. Therefore, the sealing resin 8 is cured. In this sealing step, a method for embedding a semiconductor chip 5 in a sheet shaped sealing sheet (for example, see JP-A-2013-7028) can also be adopted. In addition to the method for molding a sealing resin with a mold, a gel sealing method for casting silicone gel into a case type container may be used.

Next, heating is performed as necessary, to completely cure the sealing resin 8 that is insufficiently cured in the sealing step (post curing step). The heating temperature in this step differs depending on the type of the sealing resin. However, the heating temperature is in a range of 165 to 185° C., for example, and the heating time is in a range of about 0.5 to about 8 hours.

The thermal bonding sheet of the present invention and the thermal bonding sheet with dicing tape can be suitably used when laminating a plurality of semiconductor chips to carry out three-dimensional mounting. At this time, a thermal bonding sheet and a spacer may be laminated between the semiconductor chips, or only a thermal bonding sheet may be laminated between semiconductor chips without laminating a spacer. The mode of mounting can be appropriately changed according to the manufacturing condition and the use, or the like.

The thermal bonding sheet of the present invention and the thermal bonding sheet with dicing tape are not limited to the uses illustrated above, and can be used for thermally bonding two objects.

Examples

Hereinafter, the present invention will be described in detail by way of examples. However, the present invention is not limited to the examples below as long as the present invention does not exceed the gist thereof.

Components used in Examples will be described.

Copper particles A (average particle diameter: 150 nm, crystallite diameter size: 30 nm)

Copper particles B (average particle diameter: 300 nm, crystallite diameter size: 30 nm)

Thermally decomposable binder A (polypropylene carbonate resin): QPAC 40 manufactured by Empower Materials Inc., solid at 23° C.

Low-boiling binder B (terpene alcohol-based binder (Terusolve MTPH manufactured by Nippon Terpene Chemicals, Inc.))

Organic binder C (acrylic resin): MM-2002-1 manufactured by Fujikura Kasei Co., Ltd., solid at 23° C.

Organic solvent A: Methyl ethyl ketone (MEK)

[Preparation of Thermal Bonding Sheet]

According to the ratio of blending of compounds described in Table 1, each component and solvent described in Table 1 were placed in a stirring pot of a hybrid mixer (HM-500 manufactured by KEYENCE CORPORATION), and were stirred and mixed in a stirring mode for 3 minutes.

The obtained varnish was applied onto a released-treated film (MRA50 manufactured by Mitsubishi Plastics, Inc.), followed by drying. The varnish was dried at 80° C. for 2 minutes. As a result, thermal bonding sheets each having a thickness of 65 μm according to Examples and Comparative Examples were obtained.

[Reliability Evaluation]

A silicon chip (thickness: 350 μm, length: 5 mm, width: 5 mm) was prepared, in which a Ti layer (thickness: 50 nm) and an Ag layer (thickness: 100 nm) were formed in this order on a back surface. The thermal bonding sheet of each of Examples and Comparative Examples was bonded to the Ag layer surface of the prepared silicon chip.

The bonding conditions of a temperature of 70° C., a pressure of 0.3 MPa, and a speed of 10 mm/sec were set.

A copper plate (thickness: 3 mm) entirely covered with an Ag layer (thickness: 5 μm) was prepared. The thermal bonding sheet with a silicon chip (prepared as above) was temporarily adhered onto the prepared copper plate. The pressure during temporary adhesion is 0.1 MPa.

Next, temperature increasing and bonding were performed under the following heating conditions.

<Heating Conditions>

A sample was heated at a temperature increasing rate of 1.5° C./sec from 80° C. to 300° C. under a pressure of 10 MPa (flat plate press), and then held (bonded) at 300° C. for 2.5 minutes. The atmospheres during temperature increasing and bonding were as shown in Table 1.

After the heating, air cooling was performed until the temperature reached 170° C., and water cooling was then performed until the temperature reached 80° C. The water-cooling is provided by a water-cooling type cooling plate provided in a pressurizing plate.

Next, a sample for evaluation was charged into a heat/cold shock testing machine (TSE-103ES manufactured by ESPEC CORPORATION), and subjected to heat/cold shock of −40° C. to 200° C. for 100 cycles. At this time, the sample was held at −40° C. for 15 minute and 200° C. for 15 minutes.

After 100 cycles, an image was taken using an ultrasonic imaging device [SAT] (FineSAT II manufactured by Hitachi Kenki FineTech Co., Ltd.), to confirm a portion where the silicon chip and the copper plate were bonded by the sintered layer. A transducer (probe) used is PQ-50-13: WD [frequency: 50 MHz].

The area (residual area) of a portion where bonding remained in the obtained image was determined, and the ratio of the residual area with respect to the total area (residual bonding area ratio) was calculated. The case where the residual bonding area ratio was 50% or more was evaluated as good, and the case where the residual bonding area ratio was lower than 50% was evaluated as poor. The results are shown in Table 1. In the image obtained by the ultrasonic imaging device, a portion where the silicon chip and the substrate are peeled off from each other looks white, and a portion where the bonding remains looks gray.

TABLE 1

|  |  |  | Example 1 | Example 2 | Example 3 | Example 4 | Comparative Example 1 | Comparative Example 2 |
|---|---|---|---|---|---|---|---|---|
| Blending | Copper particles A (parts by weight) |  | 100 | 100 | 80 | 80 | 100 | 100 |
|  | Copper particles B (parts by weight) |  | — | — | 20 | 20 | — | — |
|  | Thermally decomposable binder A (parts by weight) | QPAC40 | 7 | 7 | 7 | 7 | — | — |
|  | Low-boiling binder B (parts by weight) | MTPH | 10 | 10 | 10 | 10 | 10 | 10 |
|  | Organic binder C (parts by weight) | MM-2002-1 | — | — | — | — | 7 | 7 |
|  | Organic solvent A (parts by weight) | Methyl ethyl ketone | 45 | 45 | 45 | 45 | 45 | 45 |
|  | Atmosphere |  | Nitrogen | Reduced pressure | Nitrogen | Reduced pressure | Nitrogen | Reduced pressure |
| Evaluation | Residual bonding area ratio |  | 85% | 85% | 80% | 69% | 25% | 24% |
|  | Reliability Evaluation |  | good | good | good | good | poor | poor |

REFERENCE CHARACTERS LIST

1: Base
2: Pressure-sensitive adhesive layer
3, 3': Thermal bonding sheet
4: Semiconductor wafer
5: Semiconductor chip
6: Adherend
7: Bonding wire
8: Sealing resin
10, 12: Thermal bonding sheet with dicing tape
11: Dicing tape
30: Thermal bonding sheet with separator on each of surfaces
31: Pre-sintering layer
32: First separator
34: Second separator

The invention claimed is:

1. A thermal bonding sheet comprising a pre-sintering layer containing a mixture of copper particles and polypropylene carbonate.

2. The thermal bonding sheet according to claim 1, wherein the copper particles have an average particle size in a range of 10 to 1000 nm.

3. The thermal bonding sheet according to claim 1, wherein
   each of the copper particles is composed of a plurality of crystallites; and
   each of the crystallites has a crystallite diameter of 50 nm or less.

4. A thermal bonding sheet with dicing tape, comprising:
   a dicing tape; and
   the thermal bonding sheet according to claim 1 stacked on the dicing tape.

5. A bonded body production method comprising the steps of:
   preparing the thermal bonding sheet according to claim 1; and
   thermally bonding two objects to be bonded with the thermal bonding sheet interposed between the two objects to be bonded,
   wherein a bonding temperature in the thermal bonding step is in a range of 200 to 400° C.

6. The method according to claim 5, wherein the thermal bonding step is performed in a nitrogen atmosphere, in a reduced pressure, or in a reducing gas atmosphere.

7. A power semiconductor device comprising:
   the thermal bonding sheet according to claim 1; and
   a power semiconductor element.

\* \* \* \* \*